United States Patent
Emrick et al.

(10) Patent No.: US 7,282,797 B2
(45) Date of Patent: Oct. 16, 2007

(54) GRADED LIQUID CRYSTAL POLYMER PACKAGE

(75) Inventors: Rudy M. Emrick, Gilbert, AZ (US); Bruce A. Bosco, Phoenix, AZ (US); Stephen K. Rockwell, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 156 days.

(21) Appl. No.: 11/139,400

(22) Filed: May 27, 2005

(65) Prior Publication Data

US 2006/0267181 A1 Nov. 30, 2006

(51) Int. Cl.
  *H01L 23/12* (2006.01)
  *H01L 23/053* (2006.01)
(52) U.S. Cl. .................. 257/702; 257/701; 438/125
(58) Field of Classification Search ............. 257/701, 257/702, 703, 709; 438/125, 780

See application file for complete search history.

(56) References Cited

U.S. PATENT DOCUMENTS

| 6,722,031 | B2 * | 4/2004 | Japp et al. | 29/852 |
| 2005/0006744 | A1 * | 1/2005 | Ooi et al. | 257/686 |
| 2005/0099783 | A1 * | 5/2005 | Alcoe et al. | 361/748 |
| 2005/0252682 | A1 * | 11/2005 | Shimoto et al. | 174/260 |
| 2006/0008579 | A1 * | 1/2006 | Yamasaki et al. | 427/79 |
| 2006/0261464 | A1 * | 11/2006 | Modi et al. | 257/700 |
| 2006/0289989 | A1 * | 12/2006 | Yee et al. | 257/720 |

OTHER PUBLICATIONS

Z. Wei et al., "Liquid Crystal Polymer (LCP) for Microwave/Millimeter Wave Multi-Layer Packaging," 2003 IEEE, 2003 IEEE MIT-S Digest, pp. 2273-2276.

M.F. Davis et al., "Liquid Crystal Polymer-based Integrated Passive Development for RF Applications," 2003 IEEE, 2003 IEEE MIT-S Digest, pp. 1155-1158.

Kellee Brownlee et al., "Evaluation of Liquid Crystal Polymers for High Performance SOP Application," 2002 IEEE, 2002 Electronic Components and Technology Conference, pp. 676-680.

Liu Chen et al., "Process Development and Reliability for System-in-a-Package Using Liquid Crystal Polymer Substrate," 2004 IEEE, 2004 Electronic Components and Technology Conference, pp. 24-28.

Hironori Asai et al., "An Organic and Ceramic Laminated BGA Package with High Thermal and Electrical Performance Characteristics," 1997 IEEE, 1997 IEEE/CPMT Int'l Electronics and Manufacturing Technology Symposium, pp. 391-395.

Hironori Asai et al., "Design and Characteristics of a Newly Developed Cavity-Up Plastic and Ceramic Laminated Thin BGA Package," 1999 IEEE, IEEE Transactions on Advanced Packaging, vol. 22, No. 3, Aug. 1999, pp. 460-467.

(Continued)

*Primary Examiner*—S. V. Clark

(57) ABSTRACT

A device (10) is provided for matching the CTE between substrates (12, 14), e.g., a semiconductor substrate and packaging material. The first substrate (12) has a first coefficient of thermal expansion and the second substrate (14) has a second coefficient of thermal expansion. At least two layers (16) of liquid crystal polymer are formed between the first substrate (12) and the second substrate (14), each layer having a unique coefficient of thermal expansion progressively higher in magnitude from the first substrate (12) to the second substrate (14).

20 Claims, 2 Drawing Sheets

OTHER PUBLICATIONS

J. Kivilahti et al., "Panel-Size Component Integration (PCI) with Molded Liquid Crystal Polymer (LCP) Substrates," 2002 IEEE, 2002 Electronic Components and Technology Conference, pp. 955-961.

Kellee Brownlee et al., "Evaluation of Low Stress Dielectrics for Board Applications," 2003 IEEE, 2003 Electronic Components and Technology Conference, pp. 136-141.

* cited by examiner

GRADED LIQUID CRYSTAL POLYMER PACKAGE

FIELD OF THE INVENTION

The present invention generally relates to integrated circuit packaging, and more particularly to attaching an integrated circuit to a substrate.

BACKGROUND OF THE INVENTION

With the growth of the use of personal communication devices, e.g., cell phones and two way radios, high performance and high frequency packaging materials have increased in importance. Desired characteristics for electronic packaging include high electric and thermal performance, thinness, low weight, small size, high component density, and low cost.

When attaching an integrated circuit to a packaging material, e.g., a printed circuit board or a polymer material, it is known that the coefficient of thermal expansion (CTE) of the integrated circuit and the packaging material must be matched. When the CTE of the two materials are matched, the two materials will expand and contract simultaneously over temperature so as to avoid deformities, cracking, detachment, and loss of functionality, especially after a number of temperature cycles. The importance of this matched CTE becomes apparent in many applications having large temperature swings, e.g., automotive electronics.

Conventional packages are fabricated from materials such as plastic, Teflon or ceramics. The type of material that is used depends on a number of factors which include frequency of operation, environment and cost. Plastic packages are typically the lowest in cost but may not be suitable for high frequencies of operation or very high temperatures. Applications that require exposure to extreme temperatures will commonly use ceramics. The metallization that can be used will typically differ depending on the packaging material. As the frequency of operation increases, factors such as surface roughness and metal thickness become important. In addition to these factors, as the frequency of operation increases it becomes advantageous to utilize materials that have lower dielectric constants to allow for the implementation so that the final package, with interconnects, will avoid noise or signal loss associated with high speed circuits One known solution is to place the integrated circuit on the substrate and within a hole formed in a liquid crystal polymer material; however, this adds complexity to the manufacturing process.

Another known solution involves the formation of a single layer of liquid crystal polymer between two non-liquid crystal polymer substrates; however, this results in layers that will not have as good a performance at a high frequency as liquid crystal polymer.

Accordingly, it is desirable to provide a liquid crystal polymer package that matches the CTE of an integrated circuit to that of the packaging material. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A device is provided for matching the CTE of two substrates. The device comprises a first substrate having a first coefficient of thermal expansion and a second substrate having a second coefficient of thermal expansion. At least two layers of liquid crystal polymer are formed between the first substrate and the second substrate, each layer having a unique coefficient of thermal expansion progressively higher in magnitude from the first substrate to the second substrate. The first and second substrates may comprise a semiconductor substrate and packaging material.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
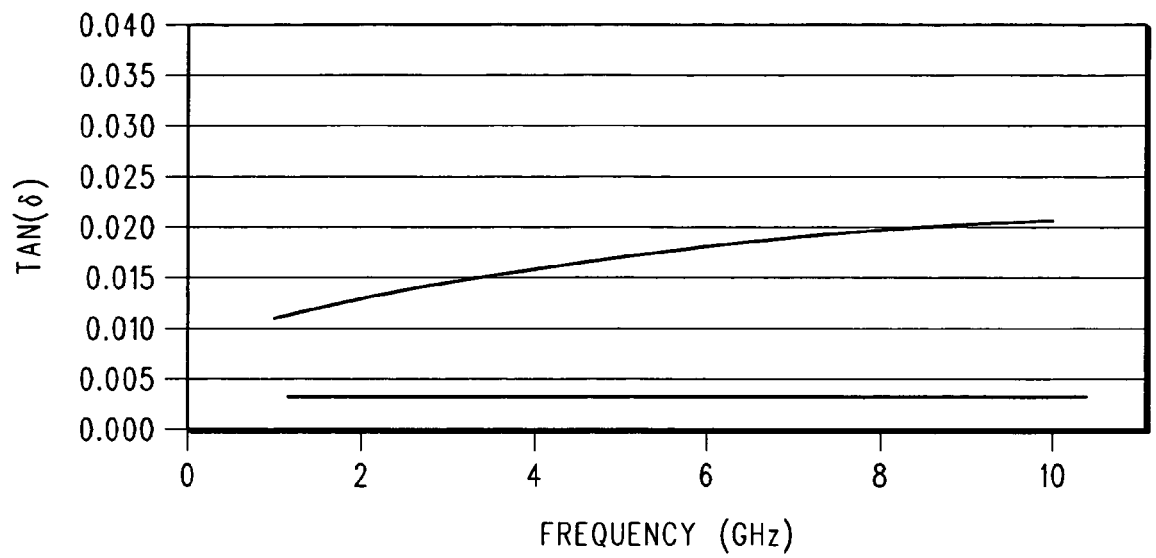
FIG. 1 is a graph demonstrating the moisture barrier properties of the material used in an exemplary embodiment of the present invention.

Liquid crystal polymer (LCP) combines the properties of polymers with those of liquids and provide superior thermal and electrical properties including low loss, low dielectric constant, and low coefficient of thermal expansion (CTE) characteristics. LCP packages are especially advantageous for RF devices due to their low signal toss and low dielectric constant (3.01 at 1 MHz) over a wide frequency range and superior moisture barrier properties (0.04% water absorption). FIG. 1 shows that LCP 4 demonstrates superior moisture barrier properties as compared with two other conventional substrate materials, an organic material 6 and polyimide 8, relative to loss tangent. The dielectric constant is important for RF packaging because it determines the characteristic impedance of the circuitry, which relates to size and to the signal loss of the circuitry. Loss tangent is important and directly related to circuit signal losses and Q factor. Q factor is a figure merit in filters, resonators, and low noise circuits.

LCP is an ordered thermoplastic polymer with long stiff molecules that offer an excellent combination of electronic, thermal, mechanical and chemical properties that make them an excellent material choice for electronic packaging. LCPs are highly crystalline materials based on aromatic ring-structured compounds that are very stable after polymerizing. Characteristics of a particular LCP depend on the manufacturer, but exist in a variety of unfilled, glass-filled, mineral-filled, carbon fiber reinforced, and glass fiber-reinforced grades that allow for numerous options in key properties such as the CTE. LCP laminates have a CTE that can be readily matched to that of silicon and other materials. Also, the high moisture and chemical resistance improve LCP performance in unfriendly operating environments, and the low CTE, low dielectric constant, and high dielectric strength make it desirable as circuit board laminates for electronics packaging. Furthermore, LCP has a high moisture barrier which may be used to seal and protect electronic components from high humidity.

Figure 2:
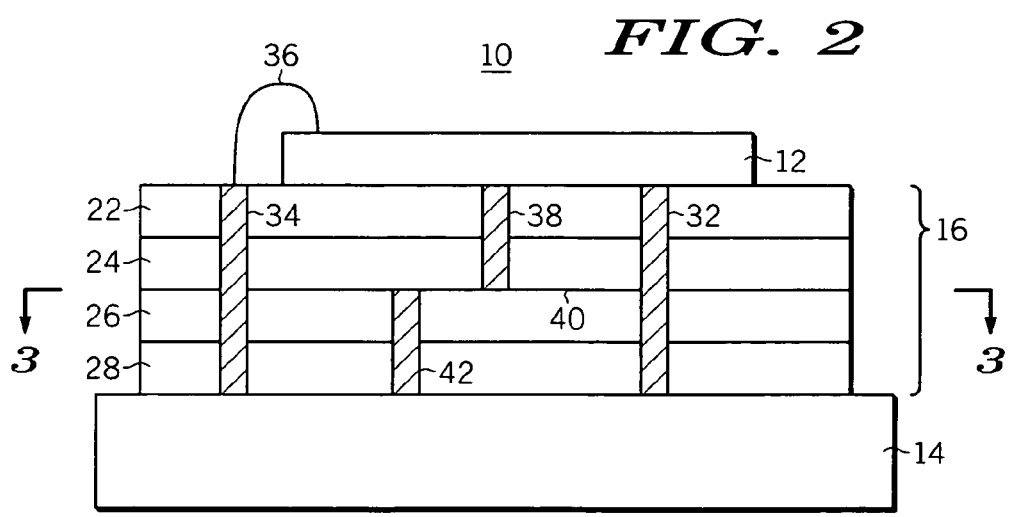
FIG. 2 is a cross-sectional view of an exemplary embodiment of the present invention taken along the line 3-3 of FIG. 3.
Figure 3:
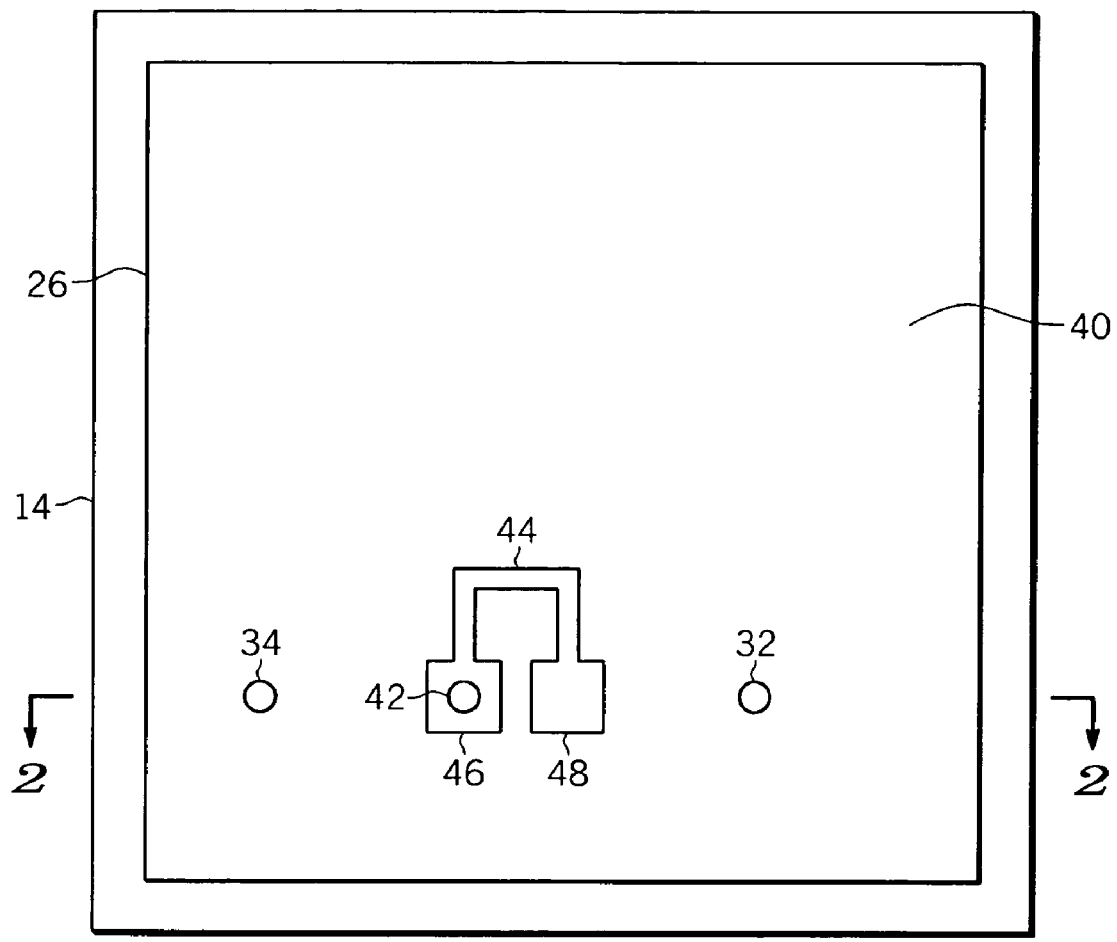
FIG. 3 is a top cross-sectional view taken along the line 2-2 of FIG. 2.

In an exemplary embodiment and referring to the device 10 of FIG. 2, a cross sectional view is shown as viewed along the line 3-3 of FIG. 3. The CTE of the first substrate 12 is lower than the CTE of the second substrate 14 so that attaching them directly together would cause deformities or cracks, for example, in one or both of the first substrate 12 or second substrate 14. In general, graded layers 16 of LCP provide a transition in CTE between the CTE of first substrate 12 and the CTE of second substrate 14. The material for each of the graded layers 16 can be selected, as desired, for a particular first substrate 12 material and a particular second substrate 14. More particularly, each of the graded layers 16 are selected such that the CTE is "stair-stepped" from the first substrate 12 to the second substrate 14.

More particularly, the graded layers 16 comprise a LCP wherein the CTE of layer 22 adjacent to the first substrate 12 is closely matched to the CTE of the first substrate 12, but slightly higher. The layer 24 adjacent layer 22 is closely matched thereto; however the CTE of layer 24 is slightly higher than the CTE of layer 22. Each successive layer of the graded layers has a CTE closely matching that of the adjacent layer, but the CTE of each of the graded layers increases as it gets closer to the second substrate 14. The CTE of the layer 28 adjacent to the second substrate 14 is closely matched to the CTE of the second substrate 14. Effectively, this approach reduces the stress build up at any one layer-to-layer interface by distributing it across multiple layer-to-layer interfaces.

In the exemplary embodiment shown in FIG. 2, one of the first or second substrates 12, 14 may comprise, for example, an integrated circuit substrate comprising silicon, but may alternative comprise any type of material used for integrated circuits, such as germanium, silicon/germanium, or a III-V compound. The other of the first or second substrates 12, 14 may comprise, for example, packaging material comprising any type of material used for electronic packaging, such as that used for printed circuit boards, a polymer, glass, etc. The thickness of the graded layers 16 may range from 1 mil to 30 mils; however the thickness of the graded layers 16 is dependent upon the frequency needed for a particular application.

An example of the thicknesses and CTEs for the first substrate 12, second substrate 14 and graded layers 16 is illustrated in the chart as follows:

| MATERIAL | THICKNESS (mils) | CTE (ppm/C.) |
| --- | --- | --- |
| first substrate 12 | 24 | 2.6 |
| layer 22 | 2 | 3.5 |
| layer 24 | 2 | 4.4 |
| layer 26 | 2 | 5.3 |
| layer 28 | 2 | 6.2 |
| second substrate 14 | 125 | 7 |

A via 32 may be formed through the graded layers 16 in a manner known to those in the industry for providing electrical connection between circuitry on the first substrate 12 and circuitry on the second substrate 14. A via 34 also formed in the graded layers 16 may make electrical contact with circuitry on the integrated substrate by a wire bond 36. A via 38 may be formed through layers 22 and 24 to terminate at the junction 40 between layers 24 and 26.

Another via 42 may be formed through layers 26 and 28 to also terminate at the junction 40.

Referring to FIG. 3, the device 10 is shown as viewed along line 2-2 of FIG. 2. Functional circuitry 44 is formed on the surface 40 of layer 26 in a manner known to those in the industry. Functional circuitry 44 may comprise any type of electronic circuitry, for example, a microstrip transmission line as shown, a coplanar waveguide, a resistor, an inductor, or filtering structures. A first end 46 of the functional circuitry 44 is connected to the via 42 and a second end 48 would be connected to the via 38.

LCP layers would be manufactured in sheet form using standard processes known to the industry. A selection of off-the-shelf and/or customized CTE LCP layers would be made for a particular application. The layers would be laminated using interleaved adhesive layers or alternating single sided metalized LCP layers, or other standard method in conjunction with the proper heat and pressure to achieve proper bonding.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A device comprising:
    a first substrate having a first coefficient of thermal expansion;
    a second substrate having a second coefficient of thermal expansion higher in magnitude than the first coefficient of thermal expansion; and
    at least two layers of liquid crystal polymer formed between the first substrate and the second substrate, each layer having a unique coefficient of thermal expansion progressively higher in magnitude from the first substrate to the second substrate.

2. The device of claim 1 wherein one of the first and second substrates comprises a packaging material.

3. The device of claim 1 wherein one of the first and second substrates comprises an integrated circuit.

4. The device of claim 3 wherein integrated circuit comprises at least one of silicon, germanium, and a III-V material.

5. The device of claim 1 wherein one of the first and second substrates comprises one of a printed circuit board, a polymer material, and a ceramic material.

6. The device of claim 1 wherein each of the two layers comprise a thickness of between 1 and 30 mils.

7. The device of claim 1 wherein at least one via is formed from the first substrate to the second substrate through the at least two layers.

8. The device of claim 1 further comprising:
    an electronic device formed between the at least two layers;
    a first via formed between the first substrate and the electronic device; and
    a second via formed between the second substrate and the electronic device.

9. A device comprising:
a semiconductor substrate having a first coefficient of thermal expansion;
a packaging material having a second coefficient of thermal expansion; and
a plurality of layers of liquid crystal polymer formed between the semiconductor substrate and the packaging material, each layer having a unique coefficient of thermal expansion progressively higher in magnitude from the first substrate to the second substrate.

10. The device of claim 9 wherein integrated circuit comprises at least one of silicon, germanium, and a III-V material.

11. The device of claim 9 wherein one of the first and second substrates comprises one of a printed circuit board, a polymer material, and a ceramic material.

12. The device of claim 9 wherein each of the two layers comprise a thickness of between 1 and 30 mils.

13. The device of claim 9 wherein at least one via is formed from the first substrate to the second substrate through the at least two layers.

14. The device of claim 9 further comprising:
an electronic device formed between the at least two layers;
a first via formed between the first substrate and the electronic device; and
a second via formed between the second substrate and the electronic device.

15. A method of making a device that matches the coefficient of thermal expansion between a first material having a first coefficient of thermal expansion and a second material having a second coefficient of thermal expansion, comprising:
forming a first layer of liquid crystal polymer adjacent the first material; and
forming a second layer of liquid crystal polymer between the second material and the first layer, the first and second layers having a unique coefficient of thermal expansion, the magnitude of the coefficient of thermal expansion of the second material being greater than that of the second layer, the second layer being greater than that of the first layer, and the first layer being greater than that of the first material.

16. The device of claim 15 wherein one of the first and second material comprises an integrated circuit.

17. The device of claim 15 wherein one of the first and second material comprises a packaging material.

18. The device of claim 15 wherein each of the first and second layers comprise a thickness of between 1 and 30 mils.

19. The device of claim 15 wherein at least one via is formed from the first material to the second material through the at least two layers.

20. The device of claim 15 further comprising:
an electronic device formed between the at least two layers;
a first via formed between the first substrate and the electronic device; and
a second via formed between the second substrate and the electronic device.

* * * * *